(12) United States Patent
Ehyaie

(10) Patent No.: US 9,160,296 B2
(45) Date of Patent: Oct. 13, 2015

(54) PASSIVE SWITCH-BASED PHASE SHIFTER

(71) Applicant: QUALCOMM Incorporated, San Diego, CA (US)

(72) Inventor: Danial Ehyaie, San Francisco, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/160,159

(22) Filed: Jan. 21, 2014

(65) Prior Publication Data

US 2015/0207486 A1 Jul. 23, 2015

(51) Int. Cl.
*H04B 3/00* (2006.01)
*H03H 7/20* (2006.01)
*H04L 25/02* (2006.01)

(52) U.S. Cl.
CPC ............. *H03H 7/20* (2013.01); *H04L 25/0298* (2013.01)

(58) Field of Classification Search
CPC ............. H03H 7/20; H03H 11/20; H01P 1/18
USPC .................................. 375/257; 333/139, 164
See application file for complete search history.

(56) References Cited

U.S. PATENT DOCUMENTS

| | | | | |
|---|---|---|---|---|
| 3,601,708 | A * | 8/1971 | Stempler et al. | 327/237 |
| 4,604,593 | A | 8/1986 | Yarman | |
| 5,680,079 | A * | 10/1997 | Inami et al. | 333/161 |
| 6,320,481 | B1 * | 11/2001 | Sharma | 333/164 |
| 6,542,051 | B1 * | 4/2003 | Nakada | 333/164 |
| 7,123,116 | B2 | 10/2006 | Hieda et al. | |
| 7,719,386 | B2 | 5/2010 | Atsumo et al. | |
| 7,764,142 | B2 | 7/2010 | Miya | |
| 2004/0155729 | A1 * | 8/2004 | Ko et al. | 333/164 |
| 2005/0093026 | A1 * | 5/2005 | Sagae et al. | 257/213 |
| 2005/0265275 | A1 * | 12/2005 | Howard et al. | 370/328 |
| 2006/0013250 | A1 * | 1/2006 | Howard et al. | 370/465 |
| 2007/0188264 | A1 | 8/2007 | Miyaguchi et al. | |
| 2008/0180189 | A1 * | 7/2008 | Miya | 333/103 |
| 2009/0089596 | A1 * | 4/2009 | Ciaffi et al. | 713/300 |

(Continued)

FOREIGN PATENT DOCUMENTS

JP 2010183192 A 8/2010

OTHER PUBLICATIONS

Byung-Wook Min "Single-Ended and Differential Ka-Band BiCMOS Phased Array Front-Ends" IEEE J. of Solid-State Circuits, Oct. 2008.*

(Continued)

*Primary Examiner* — Juan A Torres
(74) *Attorney, Agent, or Firm* — Patterson & Sheridan, LLP

(57) ABSTRACT

Certain aspects of the present disclosure provide apparatus for producing an output signal that may have a phase difference with respect to an input signal. One example phase shifting circuit for producing such an output signal generally includes a transmission line having first and second points, an impedance connected with a node and with a reference voltage level, a first switch connected with the first point of the transmission line and with the node, and a second switch connected with the second point of the transmission line and with the node, wherein a first signal input to the first point of the transmission line has a phase difference with a second signal output from the second point based on one or more properties of the transmission line when the first and second switches are open.

30 Claims, 7 Drawing Sheets

(56) References Cited

U.S. PATENT DOCUMENTS

2011/0051832 A1* 3/2011 Mergen et al. ............... 375/267
2011/0304409 A1 12/2011 Tamura

OTHER PUBLICATIONS

Cohen E., et al., "60 GHz Components in CMOS for Low Power Compact Phase Array Applications," Nov. 2009, IEEE International Conference on Microwaves, Communications, Antennas and Electronics Systems, COMCAS 2009, 5 pages.

International Search Report and Written Opinion—PCT/US2014/071898—ISA/EPO—Mar. 13, 2015.

Wei-Tsung Li et al: "60-GHz 5-bit Phase Shifter With Integrated VGA Phase-Error Compensation", IEEE Transactions on Microwave Theory and Techniques, vol. 61, No. 3, Mar. 2013, XP011495213, pp. 1224-1235.

* cited by examiner

PASSIVE SWITCH-BASED PHASE SHIFTER

TECHNICAL FIELD

Certain aspects of the present disclosure generally relate to electronic circuits and, more particularly, to passive phase shifting circuits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division $3^{rd}$ multiple access (OFDMA) systems, single-carrier FDMA (SC-FDMA) networks, Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to passive phase shifting circuits, which have lower loss and lower group delay than conventional passive phase shifting circuits. Such phase shifting circuits may be used in beamforming circuits, such as those used in radio frequency (RF) transmitters, receivers, or transceivers for wireless communications.

Certain aspects of the present disclosure provide a phase shifting circuit. The circuit generally includes a transmission line having first and second points (e.g., ends or other points located along the transmission line), an impedance connected with a node and with a reference voltage level, a first switch connected with the first point of the transmission line and with the node, and a second switch connected with the second point of the transmission line and with the node.

According to certain aspects, at least one of the first point or the second point is an end of the transmission line.

According to certain aspects, the first switch is connected directly with the first point of the transmission line and/or directly with the node. For certain aspects, the second switch is connected directly with the second point of the transmission line and/or directly with the node.

According to certain aspects, a first signal input to the first point of the transmission line has a phase difference with a second signal output from the second point based on one or more properties of the transmission line when the first and second switches are open.

According to certain aspects, the phase shifting circuit is configured to behave as an inductor-capacitor (LC) resonant circuit when the first and second switches are closed. In this case, a first signal input to the first point of the transmission line and having a signal frequency equal to a center frequency of the LC resonant circuit may have no phase difference with a second signal output from the second point of the transmission line.

According to certain aspects, the impedance includes an inductive element (and may include only an inductor for certain aspects). For certain aspects, the first and second switches are part of a double-pole, single-throw (DPST) switch. For certain aspects, the reference voltage level is an electrical ground.

Certain aspects of the present disclosure provide a digital phase shifter. The digital phase shifter generally includes a plurality of phase shifting stages and a plurality of digital control lines. Each phase shifting stage typically includes a transmission line having first and second points, an impedance connected with a node and with a reference voltage level, a first switch connected with the first point of the transmission line and with the node, and a second switch connected with the second point of the transmission line and with the node. The plurality of digital control lines may be configured to selectively control the switches in the plurality of phase shifting stages.

According to certain aspects, the first switch is connected directly with the first point of the transmission line and/or directly with the node. For certain aspects, the second switch is connected directly with the second point of the transmission line and/or directly with the node.

According to certain aspects, a first signal input to the first point of the transmission line has a phase difference with a second signal output from the second point based on one or more properties of the transmission line when the first and second switches are open.

According to certain aspects, each phase shifting stage is configured to behave as an LC resonant circuit when the first and second switches are closed. In this case, a first signal input to the first point of the transmission line and having a signal frequency equal to a center frequency of the LC resonant circuit may have no phase difference with a second signal output from the second point.

According to certain aspects, the transmission line has a different length in each of the plurality of phase shifting stages.

According to certain aspects, the impedance includes an inductive element (and may include only a single inductor for certain aspects). For certain aspects, the first and second switches are part of a double-pole, single-throw (DPST) switch. For certain aspects, the reference voltage level is an electrical ground.

According to certain aspects, the plurality of phase shifting stages is configured to operate on signals having wavelengths on the order of millimeters. For certain aspects, the plurality of phase shifting stages includes two phase shifting stages.

Certain aspects of the present disclosure provide an apparatus for wireless communications, such as an access point (AP) or a user terminal (UT). The apparatus generally includes one or more transmitting, receiving, or transceiving circuits and a processing system configured to receive data from or send the data to the one or more transmitting, receiving, or transceiving circuits. Each circuit typically includes an antenna, an amplifier connected with the antenna, and a digital phase shifter connected with the amplifier. The digital phase shifter typically includes one or more phase shifting stages and one or more digital control lines. Each phase shifting stage generally includes a transmission line having first and second points, an impedance connected with a node and with a reference voltage level, a first switch connected with the first point of the transmission line and with the node, and a second switch connected with the second point of the transmission line and with the node. The digital control lines may be configured to selectively control the switches in the phase shifting stage(s).

According to certain aspects, the digital control lines are output from the processing system, such that the processing system effectively controls the switches in the phase shifting stage(s).

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE), or some other standards. A TDMA system may implement GSM or some other standards. These various standards are known in the art.

An Example Wireless System

Figure 1:
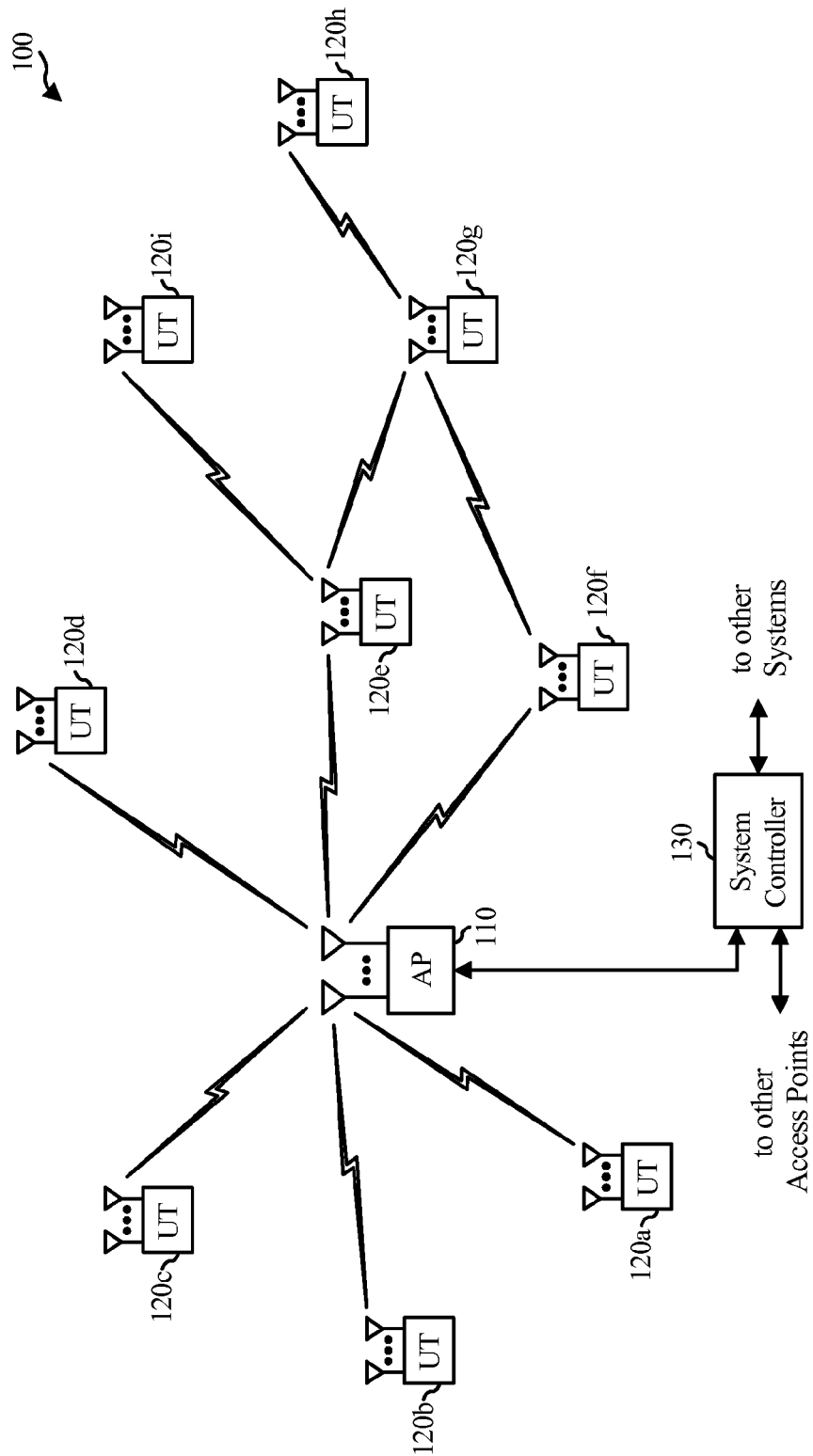
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
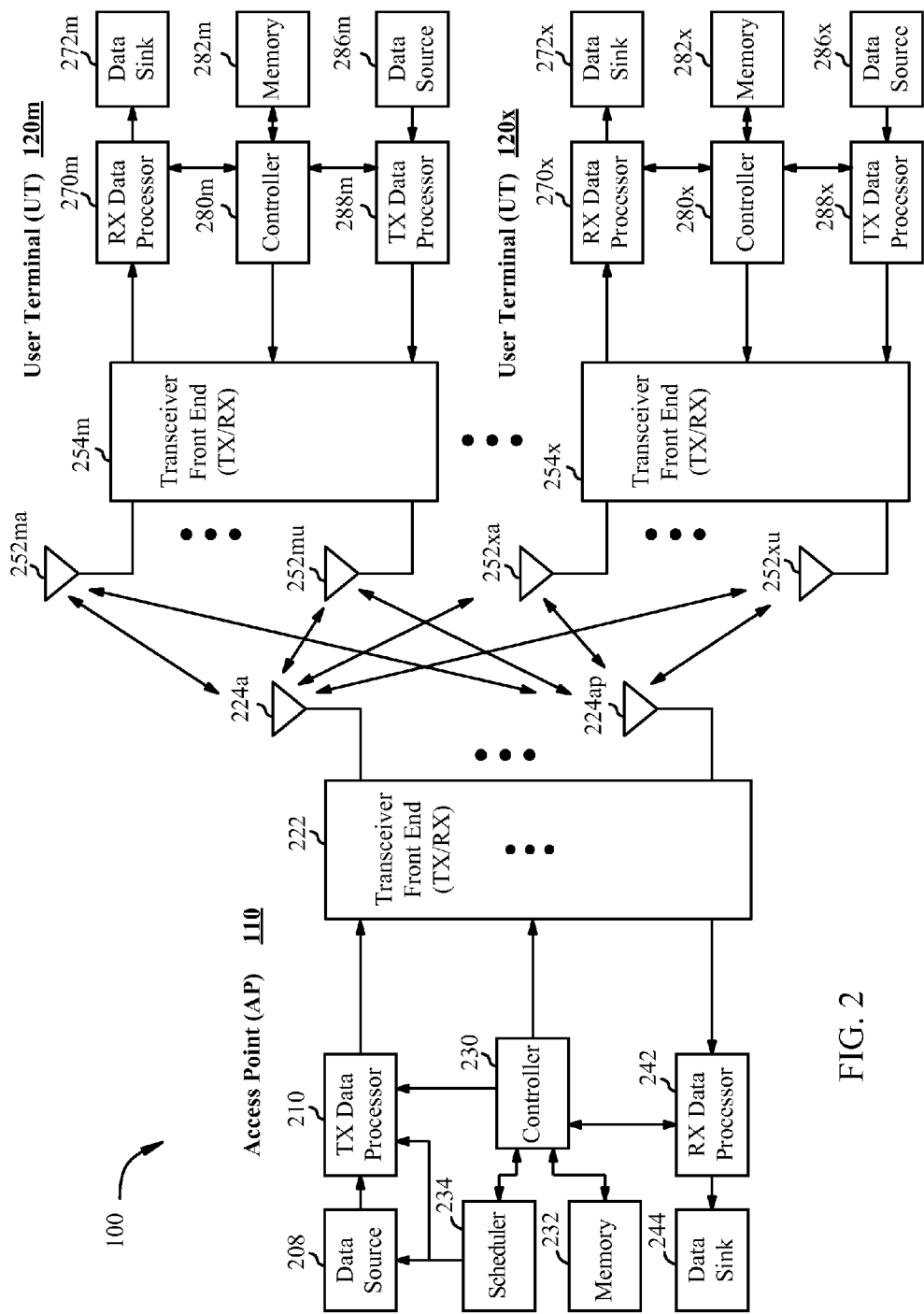
FIG. 2 is a block diagram of an example access point (AP) and example user terminals illustrating a radio frequency front end (RFFE), in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Example Phase Shifting Circuit

Figure 3:
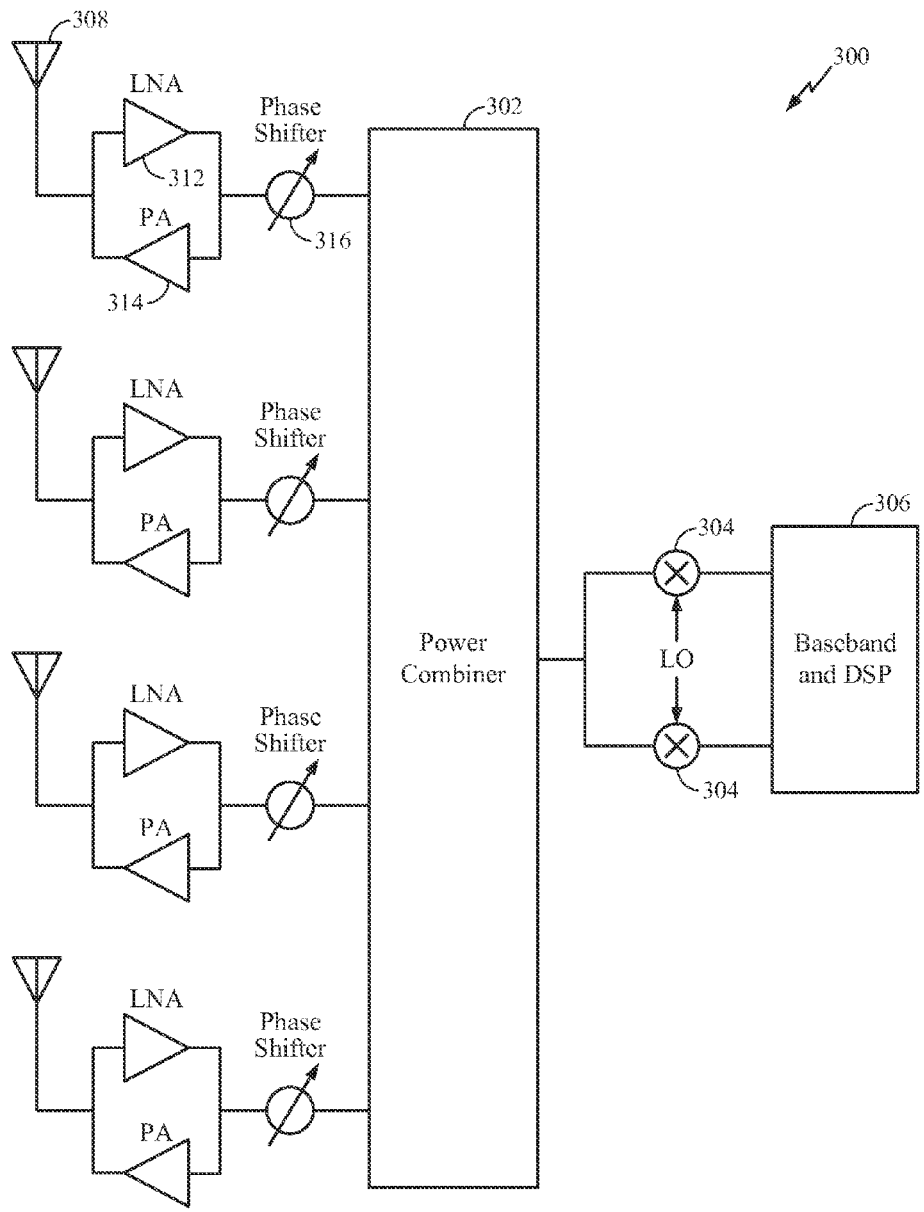
FIG. 3 is a block diagram of an example RFFE capable of beamforming using phase shifters, in accordance with certain aspects of the present disclosure.

Most wireless links operating at a millimeter wavelength (e.g., 60 GHz, 77 GHz, or 79 GHz) utilize beamforming, both in transmission (TX) and reception (RX). Almost all of these applications prefer beamforming at radio frequencies (RF). RF beamforming is typically accomplished with phase shifters, as illustrated in the example radio frequency front end (RFFE) 300 of FIG. 3.

An RFFE typically includes one or more transmitting, receiving, or transceiving chains (four transceiving chains are shown in the RFFE 300 of FIG. 3); a power combiner/divider 302; mixers 304; and a processing system 306 for baseband and digital signal processing. Each transmitting, receiving, or transceiving chain may include an antenna 308, one or more amplifiers (e.g., a low noise amplifier (LNA) 312 for signal reception or a power amplifier (PA) 314 for signal transmission), and a phase shifter 316. Although not shown in FIG. 3, each chain may also include any of various suitable additional components, such as duplexers, diplexers, couplers, switches, and the like.

The phase shifters 316 are used to shift the phase of a signal input to the phase shifter (at a particular frequency), such that a signal output from the phase shifter has a phase difference with the input signal. By using different amounts of phase shift in the various RF chains, a phased array is created, which can be utilized for beamforming for wireless communications. Furthermore, by employing variable phase shifters in the RF chains, the beamforming from the plurality of antennas 308 may be adjusted as desired.

Phase shifters can be passive or active. Passive phase shifters may be shared between TX/RX, which saves considerable real estate. In addition, passive phase shifters have almost no power consumption, which overcomes a significant challenge for cell phone applications since mm-wave circuits are power hungry. Passive phase shifters also have better linearity and noise performance. However, the biggest challenges for passive phase shifters are insertion loss and group delay.

Accordingly, what is needed are passive phase shifting circuits with low insertion loss and low group delay.

Certain aspects of the present disclosure provide a passive phase shifter, which has lower loss and lower group delay compared to conventional passive phase shifters.

Figure 4:
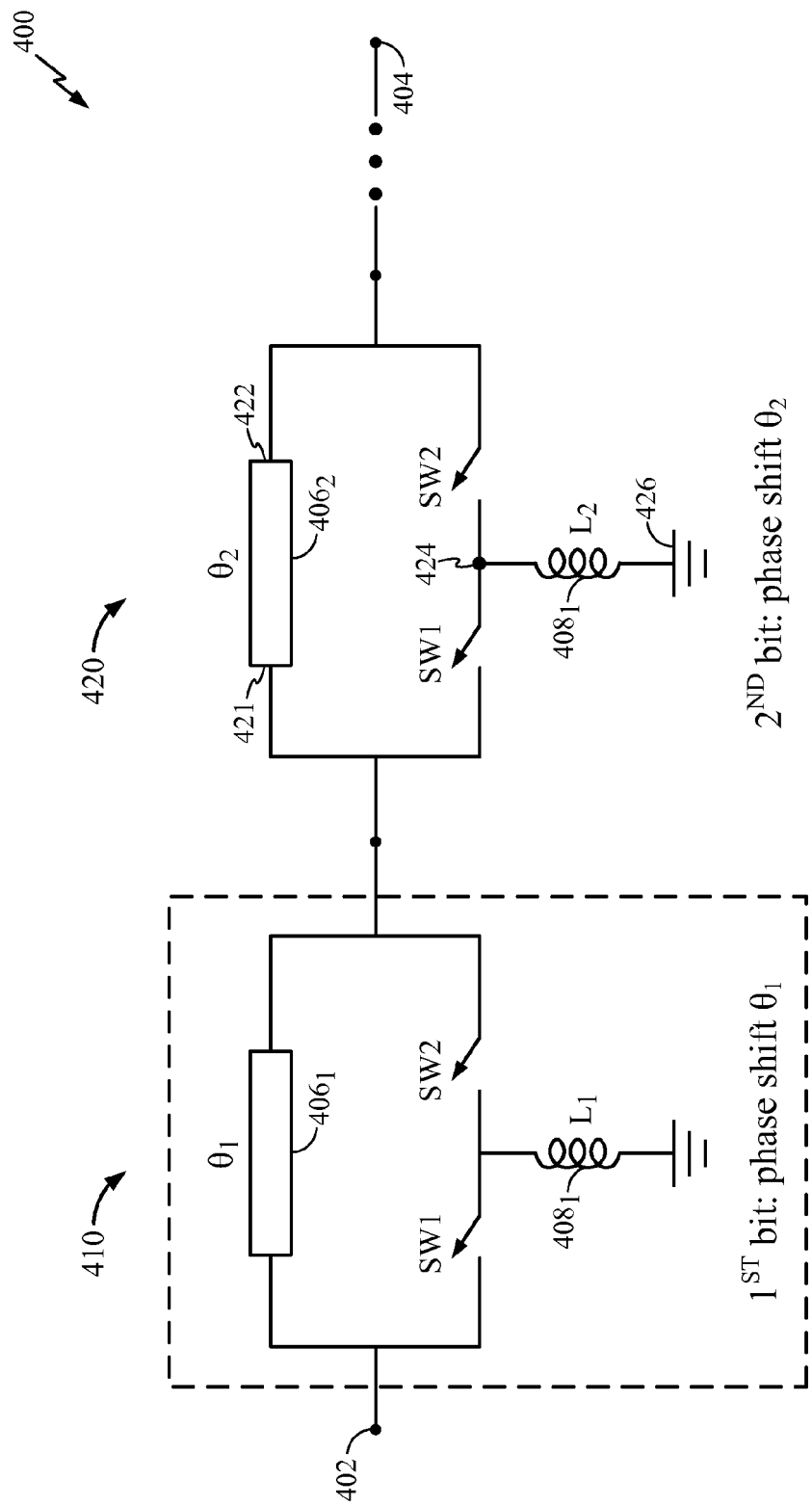
FIG. 4 is a block diagram of an example digitally-controlled phase shifter with multiple passive phase shifting stages, in accordance with certain aspects of the present disclosure.

FIG. 4 is a block diagram of an example digitally-controlled phase shifter 400 with multiple passive phase shifting stages 410, 420, in accordance with certain aspects of the present disclosure. Although only two phase shifting stages 410, 420 are depicted in FIG. 4, a phase shifter may have any desired number of phase shifting stages, including a single stage. The phase shifting stages 410, 420 are connected in series, and each phase shifting stage may provide a different amount of phase shift ($\theta$), (e.g., 180°, 90°, 45°, 22.5°, etc.). In this manner, different amounts of overall phase shift for the phase shifter 400 may be selected by using digital control lines to individually control the operation of each phase shifting stage.

For example, phase shifter 400 may be a 2-bit phase shifter, which operates using two digital control lines. In this case, the first phase shifting stage 410 may phase shift an input signal (arriving at an input terminal 402 of the phase shifter 400) either 0° (i.e., effectively no phase shift) or $\theta_1=180°$, according to a first digital control line. The second phase shifting stage 420 may phase shift the output signal from the first stage 410 either 0° or $\theta_2=90°$, according to a second digital control line, to output a signal at an output terminal 404 of the phase shifter 400. In this manner, two bits may be used to select between phase shifts of 0°, 90°, 180°, and 270° (a 180° phase shift followed by a 90° phase shift).

Each phase shifting stage may include a transmission line 406, a first switch (SW1), a second switch (SW2), and an impedance, such as an inductor 408. The transmission line 406 has first and second ends 421, 422. The impedance is connected with a node 424 and with a reference voltage level 426, which may be an electrical ground as shown. The first switch SW1 may be connected with the first end 421 of the transmission line 406 and with the node 424, and the second switch SW2 may be connected with the second end 422 of the transmission line 406 and with the node 424. In fact, any two points along the transmission line may be used for connection (with varying amounts of phase change), but for ease of description, the remainder of the present disclosure will describe using the ends 421, 422 of the transmission line.

The transmission line 406 may be formed using microstrip or any of various other suitable transmission line equivalents known to those skilled in the art. The phase shift ($\theta$) in each phase shifting stage is dictated by the properties (e.g., length) of the transmission line 406. The switches SW1 and SW2 in a phase shifting stage may be implemented as a double-pole, single-throw (DPST) switch, whose closing and opening operation is controlled by a single digital control line. The impedance in each stage may be selected to correspond to the phase-versus-frequency behavior of the transmission line 406, as explained in detail below.

For the 2-bit phase shifter shown in FIG. 4, for example, insertion loss <6 dB and group delay <3 ps were achieved at mm waves. Both of these values are much lower than conventional passive phase shifters.

Figure 5A:
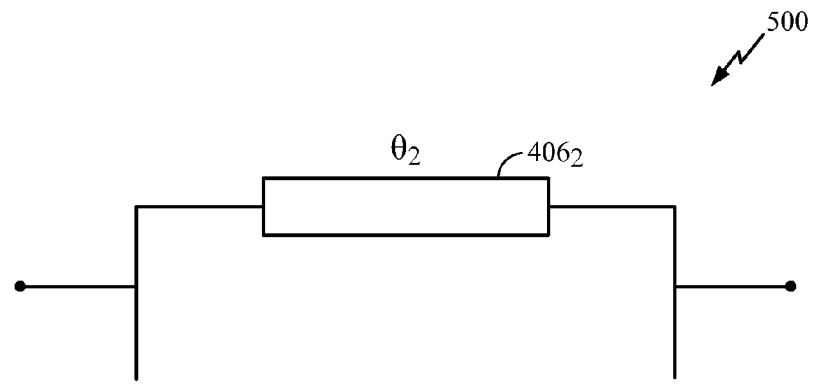
FIG. 5A is an effective block diagram of a phase shifting stage in FIG. 4 when both switches are open, in accordance with certain aspects of the present disclosure.

FIG. 5A is an equivalent circuit 500 of the phase shifting stage 420 when both switches SW1 and SW2 are open, in accordance with certain aspects of the present disclosure. If both switches are open in a given phase shifting stage, this stage has a phase difference based on the properties of the transmission line.

Figure 5B:
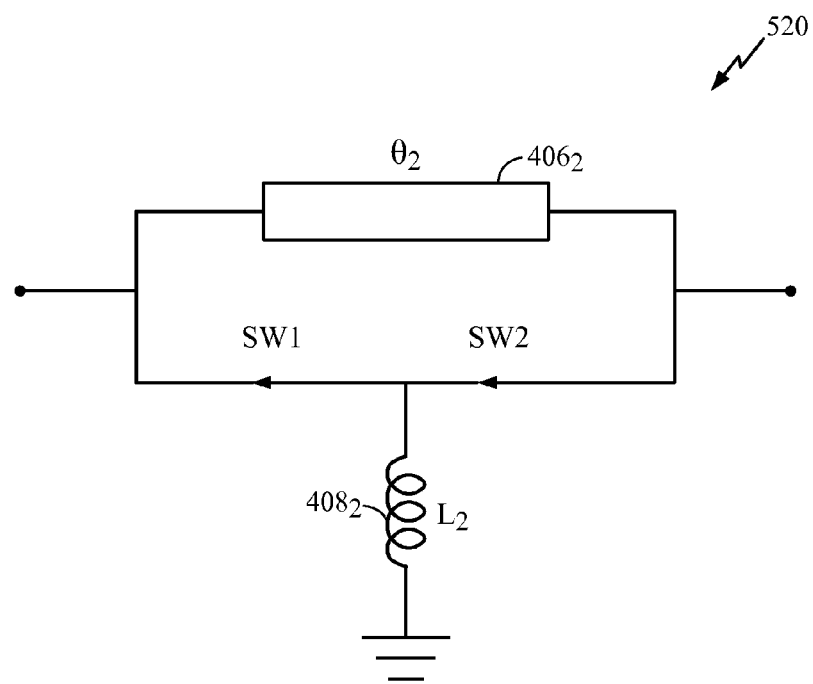
FIG. 5B is an effective block diagram of the phase shifting stage in FIG. 4 when both switches are closed, in accordance with certain aspects of the present disclosure.
Figure 6:
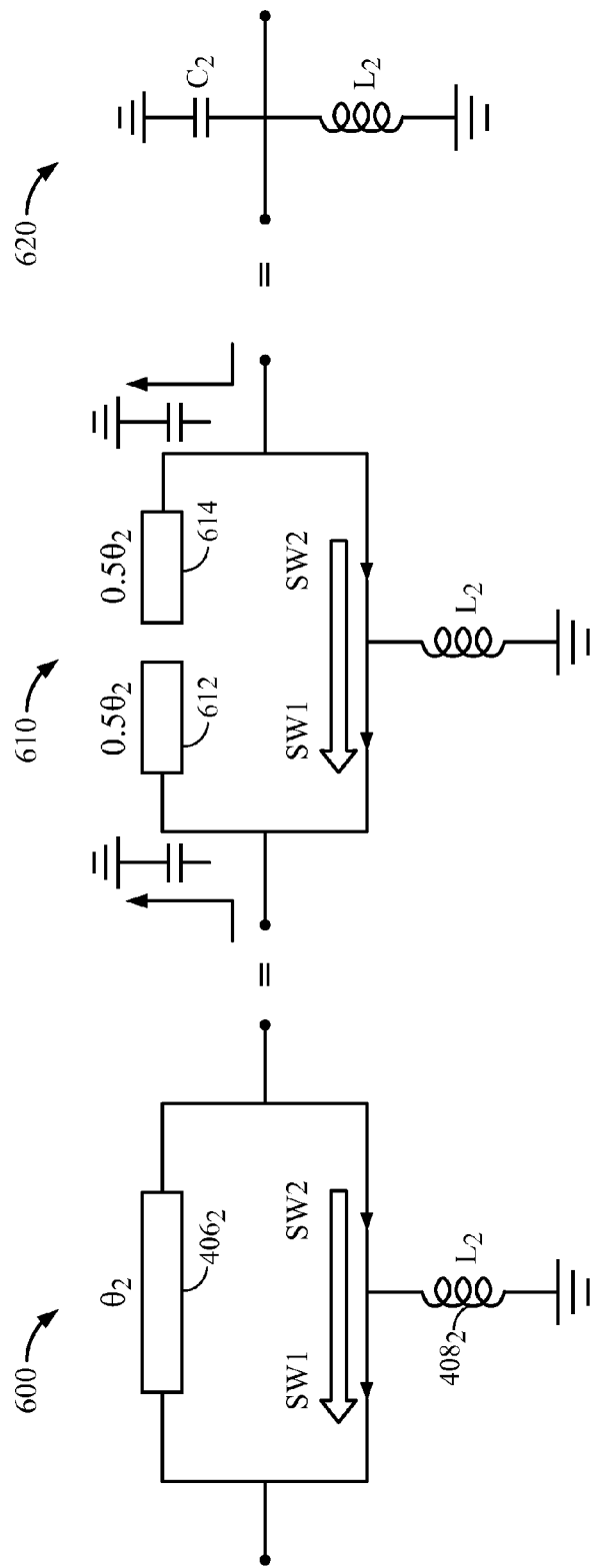
FIG. 6 illustrates equivalent circuits for the phase shifting stage of FIG. 4 if both switches are closed, in accordance with certain aspects of the present disclosure.

FIG. 5B is an equivalent circuit 520 of the phase shifting stage 420 when both switches are closed, in accordance with certain aspects of the present disclosure. When both switches are closed in a given phase shifting stage, this stage behaves as an inductor-capacitor (LC) resonator, as explained by the equivalent circuits 600, 610, and 620 in FIG. 6. Equivalent circuit 600 is the same as equivalent circuit 520 of FIG. 5B. When both switches SW1 and SW2 are closed, the transmission line 406 may be considered as being effectively divided into two halves 612, 614. This is shown in the equivalent circuit 610 of FIG. 6. Each half 612, 614 of the transmission line 406 behaves as a capacitor, such that the phase shifting stage acts like an LC resonator when both switches SW1 and SW2 are closed, as shown in the equivalent circuit 620.

The LC resonator mimics the phase-versus-frequency behavior of the transmission line (i.e., the amount of phase variation versus frequency is the same for both the LC resonator and the transmission line). In an ideal case, the phase difference between the input and output of the LC resonator at a center frequency would be zero. As the frequency changes, the phase variation of the resonator and the transmission line would be the same. In this manner, there is no (or very little) phase shift across the phase shifting stage when both switches SW1 and SW2 are closed.

Figure 7A:
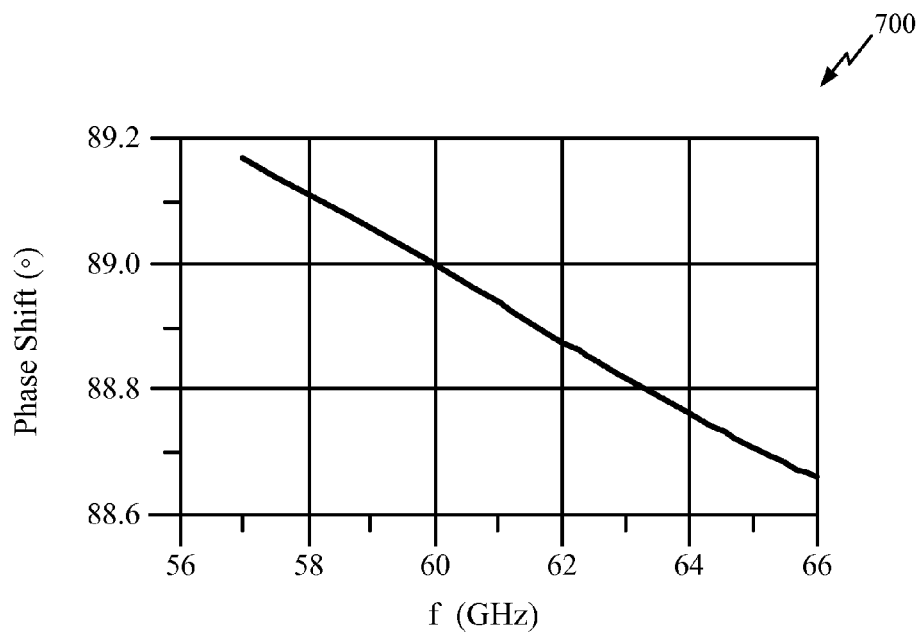
FIGS. 7A and 7B are graphs of the phase shift and group delay, respectively, versus frequency in an example phase shifting circuit, in accordance with certain aspects of the present disclosure.

FIG. 7A is an example graph 700 of the phase shift versus frequency in the two-bit phase shifter 400 of FIG. 4, in accordance with certain aspects of the present disclosure. As portrayed in the graph 700, the phase shift variation was approximately 0.5% across 9 GHz.

Figure 7B:
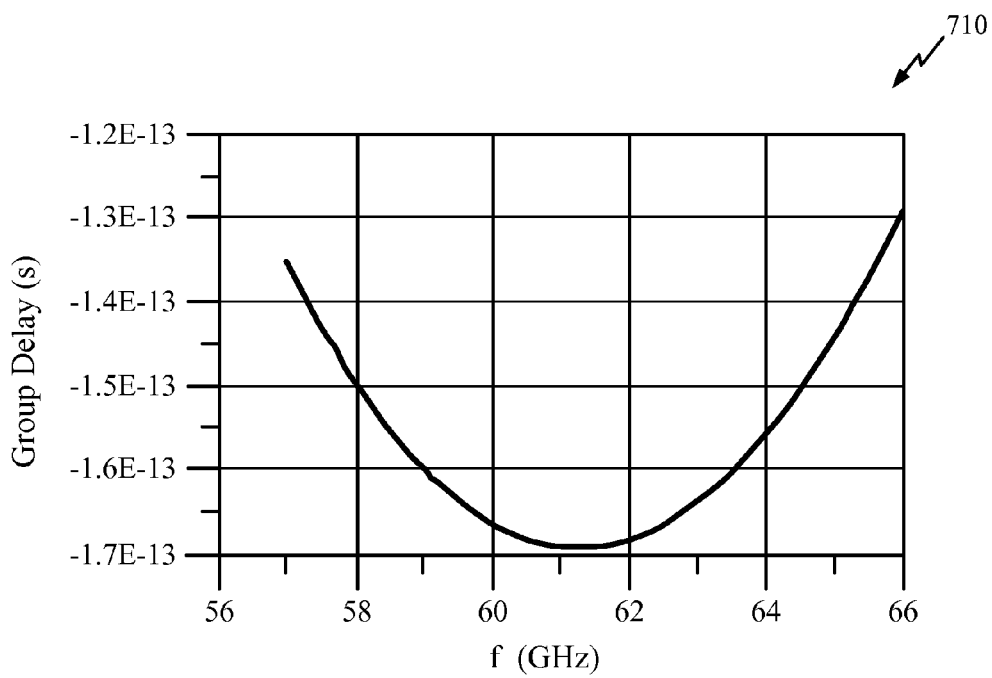

FIG. 7B is an example graph 710 of the group delay versus frequency in the two-bit phase shifter 400 of FIG. 4, in accordance with certain aspects of the present disclosure. As shown in the graph 710, the maximum group delay was about 0.17 ps.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A phase shifting circuit comprising:
a transmission line having first and second points;
an impedance connected with a node and with a reference voltage level;
a first switch connected directly with the first point of the transmission line and connected with the node; and
a second switch connected with the second point of the transmission line and with the node, wherein a first signal input to the first point of the transmission line has a phase difference with a second signal output from the second point based on one or more properties of the transmission line when the first and second switches are open.

2. The phase shifting circuit of claim 1, wherein at least one of the first point or the second point is an end of the transmission line.

3. The phase shifting circuit of claim 1, wherein the first switch is connected directly with the first point of the transmission line and directly with the node.

4. The phase shifting circuit of claim 1, wherein the phase shifting circuit is configured to behave as an inductor-capacitor (LC) resonant circuit when the first and second switches are closed.

5. The phase shifting circuit of claim 1, wherein the first and second switches are part of a double-pole, single-throw (DPST) switch.

6. The phase shifting circuit of claim 1, wherein the reference voltage level is an electrical ground.

7. The phase shifting circuit of claim 1, wherein the impedance comprises an inductive element and wherein the impedance corresponds to a phase-versus-frequency behavior of the transmission line.

8. The phase shifting circuit of claim 3, wherein the second switch is connected directly with the second point of the transmission line and directly with the node.

9. The phase shifting circuit of claim 4, wherein the first signal input to the first point of the transmission line and having a signal frequency equal to a center frequency of the LC resonant circuit has no phase difference with the second signal output from the second point.

10. A digital phase shifter comprising:
a plurality of phase shifting stages, wherein each phase shifting stage comprises:
a transmission line having first and second points;
an impedance connected with a node and with a reference voltage level;
a first switch connected with the first point of the transmission line and with the node; and
a second switch connected directly with the second point of the transmission line and connected with the node, wherein a first signal input to the first point of the transmission line has a phase difference with a second signal output from the second point based on one or more properties of the transmission line when the first and second switches are open; and
a plurality of digital control lines for selectively controlling the switches in the plurality of phase shifting stages.

11. The phase shifter of claim 10, wherein at least one of the first point or the second point is an end of the transmission line.

12. The phase shifter of claim 10, wherein the second switch is connected directly with the second point of the transmission line and directly with the node.

13. The phase shifter of claim 10, wherein each phase shifting stage is configured to behave as an inductor-capacitor (LC) resonant circuit when the first and second switches are closed.

14. The phase shifter of claim 10, wherein the first and second switches are part of a double-pole, single-throw (DPST) switch.

15. The phase shifter of claim 10, wherein the reference voltage level is an electrical ground.

16. The phase shifter of claim 10, wherein the transmission line has a different length in each of the plurality of phase shifting stages.

17. The phase shifter of claim 10, wherein the plurality of phase shifting stages are configured to operate on signals having wavelengths on the order of millimeters.

18. The phase shifter of claim 10, wherein the plurality of phase shifting stages comprises two phase shifting stages.

19. The phase shifter of claim 10, wherein the impedance comprises an inductive element.

20. The phase shifter of claim 12, wherein the first switch is connected directly with the first point of the transmission line and directly with the node.

21. The phase shifter of claim 13, wherein the first signal input to the first point of the transmission line and having a signal frequency equal to a center frequency of the LC resonant circuit has no phase difference with the second signal output from the second point.

22. An apparatus for wireless communications, comprising:
one or more transmitting, receiving, or transceiving circuits, each circuit comprising:
an antenna;
an amplifier connected with the antenna; and
a digital phase shifter connected with the amplifier, comprising:
one or more phase shifting stages, wherein each phase shifting stage comprises:
a transmission line having first and second points;
an impedance connected with a node and with a reference voltage level;
a first switch connected directly with the first point of the transmission line and connected with the node; and
a second switch connected with the second point of the transmission line and with the node, wherein a first signal input to the first point of the transmission line has a phase difference with a second signal output from the second point based on one or more properties of the transmission line when the first and second switches are open; and
one or more digital control lines for selectively controlling the switches in the one or more phase shifting stages; and
a processing system configured to receive data from or send the data to the one or more transmitting, receiving, or transceiving circuits.

23. The apparatus of claim 22, wherein at least one of the first point or the second point is an end of the transmission line.

24. The apparatus of claim 22, wherein the first switch is connected directly with the first point of the transmission line and directly with the node.

25. The apparatus of claim 22, wherein each phase shifting stage is configured to behave as an inductor-capacitor (LC) resonant circuit when the first and second switches are closed.

26. The apparatus of claim 22, wherein the first and second switches are part of a double-pole, single-throw (DPST) switch.

27. The apparatus of claim 22, wherein the transmission line has a different length in each of the one or more phase shifting stages.

28. The apparatus of claim 22, wherein the impedance comprises an inductive element.

29. The apparatus of claim 24, wherein the second switch is connected directly with the second point of the transmission line and directly with the node.

30. The apparatus of claim 25, wherein the first signal input to the first point of the transmission line and having a signal frequency equal to a center frequency of the LC resonant circuit has no phase difference with the second signal output from the second point.

\* \* \* \* \*